United States Patent
Choi et al.

(10) Patent No.: US 9,128,460 B2
(45) Date of Patent: Sep. 8, 2015

(54) PHOTOPOLYMER COMPOSITION FOR RECORDING HOLOGRAM, AND PHOTOPOLYMER LAYER AND HOLOGRAM RECORDING MEDIA INCLUDING THE SAME

(71) Applicant: SAMSUNG ELECTRONICS CO., LTD., Suwon-si (KR)

(72) Inventors: Chil-sung Choi, Suwon-si (KR); Kyoung-seok Pyun, Seoul (KR); Alexander Morozov, Moscow (RU); Sang-yoon Oh, Seoul (KR); Evgeny V. Vasiljev, Novosibirsk (RU); Vladimir V. Shelkovnikov, Novosibirsk (RU)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/075,320

(22) Filed: Nov. 8, 2013

(65) Prior Publication Data
US 2014/0127611 A1 May 8, 2014

(30) Foreign Application Priority Data

Nov. 8, 2012 (RU) ................. 2012147529
Mar. 15, 2013 (KR) ......... 10-2013-0028236

(51) Int. Cl.
*G03H 1/26* (2006.01)
*G03H 1/02* (2006.01)
*G03H 1/28* (2006.01)
*G03F 7/028* (2006.01)
(Continued)

(52) U.S. Cl.
CPC ............... *G03H 1/02* (2013.01); *G03F 7/028* (2013.01); *G03F 7/029* (2013.01); *G03F 7/032* (2013.01); *G03H 1/28* (2013.01); *G11B 7/24044* (2013.01); *G03H 2260/12* (2013.01); *G03H 2260/30* (2013.01); *G11B 7/245* (2013.01)

(58) Field of Classification Search
CPC ....... G03H 1/02; G03H 1/28; G03H 2260/30; G03H 2260/12; G03F 7/032; G03F 7/029; G03F 7/028; G11B 7/24044; G11B 7/245
See application file for complete search history.

(56) References Cited

U.S. PATENT DOCUMENTS 3,652,275 A * 3/1972 Baum et al. .................. 430/269
4,937,159 A * 6/1990 Gottschalk et al. ........... 430/138
(Continued)

FOREIGN PATENT DOCUMENTS

| JP | 07-018020 | * | 1/1995 |
| JP | 2000-214747 | * | 8/2000 |

(Continued)

OTHER PUBLICATIONS

Meka et al. "Development of panchromatic acrylamide based photopolymer for multicolour reflection holography", Appl. Opt. vol. 49(8) pp. 1400-1405 (2010).*

(Continued)

*Primary Examiner* — Martin Angebranndt
(74) *Attorney, Agent, or Firm* — Sughrue Mion, PLLC (57) ABSTRACT

A photopolymer composition includes a polymer binder; a monomer for holographic recording; a photoinitiation system including an electron acceptor, at least one of an electron donor and a hydrogen atom donor, and a dye-sensitizer; and a solvent. The monomer for holographic recording includes N-acryloylthiomorpholine.

16 Claims, 3 Drawing Sheets

(51) Int. Cl.
  *G03F 7/029* (2006.01)
  *G03F 7/032* (2006.01)
  *G11B 7/24044* (2013.01)
  *G11B 7/245* (2006.01)

(56) References Cited

U.S. PATENT DOCUMENTS

| | | | | |
|---|---|---|---|---|
| 4,942,102 | A | * | 7/1990 | Keys et al. .................. 430/1 |
| 4,959,284 | A | | 9/1990 | Smothers et al. |
| 5,545,676 | A | * | 8/1996 | Palazzotto et al. ............ 522/15 |
| 2004/0067323 | A1 | * | 4/2004 | Clabburn et al. ............ 428/1.26 |
| 2005/0058910 | A1 | * | 3/2005 | Takizawa et al. ............. 430/1 |
| 2006/0057467 | A1 | * | 3/2006 | Takizawa .................... 430/1 |
| 2010/0086860 | A1 | | 4/2010 | Roelle et al. |
| 2011/0065827 | A1 | | 3/2011 | Facke et al. |
| 2011/0236803 | A1 | * | 9/2011 | Weiser et al. ................ 430/2 |
| 2012/0086993 | A1 | | 4/2012 | Hayashida et al. |
| 2012/0214089 | A1 | | 8/2012 | Honel et al. |

FOREIGN PATENT DOCUMENTS

| | | |
|---|---|---|
| KR | 10-2009-0125290 A | 12/2009 |
| KR | 10-2010-0037563 A | 4/2010 |
| KR | 10-2010-0092391 A | 8/2010 |
| RU | 2222038 * | 1/2004 |

OTHER PUBLICATIONS

Liu et al. "Effects of the chirality and functionality of monomers the holographic gratings formed in photosensitive films" J Appl. Poly. Sci., vol. 90(8) pp. 2246-2254 (2003).*

TCI america (2 pages website) (no date).*

Weiss et al. "Photopolymeric holographic recording media in-situ and real time characterization", Proc SPIE vol. 2688 pp. 11-21 (1996).*

Vasil'ev et al. "Sensitization of photopolymer materials by halogenated derivatives of xanthene and thioxanthene dyes in pulsed recording mode", High Energy Chem., vol. 44(3) pp. 204-210 (2010).*

Lamberts et al., "Novel Rose Bengal Derivatives: Synthesis and quatum yield studies", JACS 106(20) pp. 5879-5883 (1984).*

Fokin et al. "Direct amination of 2-methyl-7-chloroceramidonine with ammonia or sodamide" Khim. Geterot Soed., vol. 2(3) pp. 467-469 (1966).*

* cited by examiner

PHOTOPOLYMER COMPOSITION FOR RECORDING HOLOGRAM, AND PHOTOPOLYMER LAYER AND HOLOGRAM RECORDING MEDIA INCLUDING THE SAME

CROSS-REFERENCE TO RELATED APPLICATIONS

This application claims the benefit of Russian Patent Application No. 2012147529, filed on Nov. 8, 2012, in the Russian Intellectual Property Office, and Korean Patent Application No. 10-2013-0028236, filed on Mar. 15, 2013, in the Korean Intellectual Property Office, the disclosures of which are incorporated herein in their entireties by reference.

BACKGROUND

1. Field

Compositions and apparatuses consistent with exemplary embodiments relate to photosensitive recording media, and more particularly, to holographic photopolymer compositions for recording a three-dimensional transmission and a reflective hologram, and hologram recording media.

2. Description of the Related Art

The development of novel photopolymer compositions for holographic recording has become nowadays a very important task in laser, optic, and polygraphic applications. In a photopolymer system for recording a hologram, a polymer product is formed from a monomer by laser exposure. As a result, an interference pattern is formed and the modulation of refractive index is generated to form a phase hologram capable of reaching high diffraction efficiency in the photopolymer system.

Disadvantages inherent in silver halide and dichromated gelatin commonly used for recording a hologram do not occur in the photopolymer material. That is, by using a photopolymer for holographic recording, multi-step post-treatments (including wet post-treatment) may be avoidable, and high quality holograms in may be recorded real time.

In contrast to silver halide materials, most known non silver halide photosensitive materials based on organic or inorganic compounds are not grainy and therefore can record data with high resolutions. However, disadvantages of the materials include a limited area having enough photosensitivity in a visible spectrum area. Thus, the enlargement of the photosensitive area is a priority task.

Single layered or multi-layered holographic photopolymer materials used for recording monochrome and polychrome holograms are known. U.S. Pat. No. 4,942,102 discloses a photopolymer composition for holographic photopolymer materials, including an acryl and/or vinyl-type monomer, a polymer binder (polyvinyl acetate, polyvinyl acetal, polyvinyl formal or polyvinyl butyral), a plasticizer, and a photoinitiation system. The photoinitiation system may include a photosensitizer such as a compound from bis(p-dialkylaminobenzylidene) ketone groups, an initiator such as 2,2'-bis(o-chlorophenyl)-4,4',5,5'-tetraphenyl biimidazole, and a hydrogen donor such as 5-chloro-2-mercaptobenzothiazole, 2-mercaptobenzothiazole, 4-methyl-4H-1,2,4-triazole-3-thiol, or a mixture thereof.

The holographic materials based on the above-described composition may have a low diffraction efficiency (~5%) in an image recording step, however, they may form a reflective hologram having a diffraction efficiency of about 70-80% after a heat treatment (at about 80-160° C.) and/or a wet treatment in an organic solvent. Besides, the heating of these materials at about 30-50° C. before performing an exposing process is recommended. Also, the wet treatment of these materials to increase the diffraction efficiency thereof may be additionally conducted, however, it is not essential.

The low diffraction efficiency of an image after exposure is one of the disadvantages of these materials. In some cases, for example, in order to obtain a series of transmission Fourier holograms, it is necessary to confirm the real time information quality. In order to accomplish this requirement, a diffraction efficiency of about 20-30% is necessary in a recording step.

Another photopolymer composition is disclosed in U.S. Pat. No. 4,959,284. This composition includes a cyclopropane compound as a monomer component, and also includes a well-known dye-sensitizer, 2,5-bis[4-(diethylamino)phenyl]methylene (DEAW). By using this composition, a hologram having a high diffraction efficiency, greater than or equal to about 90%, may be obtained in a blue spectrum area. However, the sensitivity of this composition is low: about 50-150 mJ/cm$^2$.

U.S. Patent Publication No. 20100086860 discloses a photopolymer composition including unsaturated urethane derivatives having functionalized groups by monomer components. The amount of dissolved components in a polyurethane matrix is about 25 wt % based on the total amount of the composition. New methylene blue is used as a dye-sensitizer. By using the photoinitiation system, a monochrome hologram in only a red spectrum area may be recorded. This material has a sensitivity of about 5 mJ/cm$^2$ and a diffraction efficiency of greater than or equal to about 70%.

U.S. Patent Publication No. 20110065827 discloses a photopolymer composition including another monomer component of unsaturated glycidyl ether acrylate urethane. A photo material capable of recording a hologram having a high diffraction efficiency (about 80%) was obtained by using the same dye, that is, the new methylene blue. The sensitivity was about 20 mJ/cm$^2$.

U.S. Patent Publication No. 20120214089 discloses a method of preparing a photo material having sensitivity at wavelengths of 633 nm, 532 nm, and 437 nm. A photopolymer composition is based on a polyurethane matrix having an acrylate monomer and includes tetrabutylammonium tris(3-chloro-4-methylphenyl)hexylborate as a co-initiator. As a dye-sensitizer, new methylene blue ($\lambda_{max}$=632 nm), safranine O ($\lambda_{max}$=520 nm) and astrazone orange G ($\lambda_{max}$=490 nm) are used. By using this composition, a hologram having a diffraction efficiency of about 99% was recorded. The sensitivity of this material was about 9-36 mJ/cm$^2$ ($\lambda_{max}$=633 nm), about 16-128 mJ/cm$^2$ ($\lambda_{ax}$=532 nm) and about 16-128 mJ/cm$^2$ ($\lambda_{max}$=473 nm). The dispersed values of the sensitivity are due to the low reproducibility of the experimental samples, and thus, limit the commercial application of the photopolymer materials.

In U.S. Patent Publication No. 20120086993, an acryloyl monomer component of 9,9-bis[4-(2-acryloyloxyethoxy) phenyl]fluorene (Shin-Nakamura Chemical Co., Ltd., NK Ester A-BPEF) is used in a photopolymer composition. 3-Butyl-2-[3-(3-butyl-5-phenyl-1,3-benzoxazole-2(3H)-ylidene) propane-1-en-1-yl]-5-phenyl-1,3-benzoxazole-1-ium) is used as a photosensitizer in a blue-green area ($\lambda_{max}$=510 nm), and 3-ethyl-2-[5(3-ethyl-1,3-benzoxazole-2(3H)-ylidene) penta-1,3-dien-1-yl]-1,3-benzoxazole-3-ium is used as a photosensitizer in a red-green area ($\lambda_{max}$=595 nm). The thus obtained photopolymer materials in two layers may be used to record a hologram having a diffraction efficiency of about 80% and a sensitivity of about 6 mJ/cm$^2$ at a wavelength of about 473 nm, a sensitivity of about 4 mJ/cm² at a wavelength of 532 nm, and a sensitivity of about 40 mJ/cm² at a wavelength of about 633 nm.

From the analysis regarding the dye spectrum, both dyes contribute to the sensitivity in the green spectrum area. An intersection sensitization due to a sensitizer having sensitivity to different colors may affect the recording of the hologram. For example, when a photosensitizer sensitizing in a blue-green area is used, the sensitivity of the photopolymer in a green area may be decreased by the decoloring of the photosensitizer due to the sensitization to a blue area light (the same applies to the reverse case). This feature must be considered when recording a full color hologram. The recording process of the full color hologram is more complicated because the sensitivity of the dyes in the full spectrum area is different.

SUMMARY

One or more exemplary embodiments may provide photopolymer compositions, photopolymer layers for a hologram and hologram recording media for providing high diffraction efficiency and the same sensitivity in an entire visible light spectrum area and minimizing the effect of intersection decoloration (decoloration of a photosensitizer due to intersection sensitization) in full color hologram recording.

According to an aspect of an exemplary embodiment, a photopolymer composition includes a polymer binder; a monomer for holographic recording; a photoinitiation system including at least one of an electron acceptor, an electron donor and a hydrogen atom donor, and a dye-sensitizer; and a solvent. The monomer includes N-acryloylthiomorpholine of the following Chemical Formula 1

<Chemical Formula 1>

The dye-sensitizer may include, for green area sensitization, thioerythrosine triethylammonium of the following Chemical Formula 2.

<Chemical Formula 2>

The electron acceptor in the photoinitiation system for the green area sensitization may be bis(4-tert-butylphenyl)iodonium triflate of Chemical Formula 4.

<Chemical Formula 4>

The electron donor in the photoinitiation system for the green area sensitization may be 5-methyl-1,3,4-thiadiazole-2-thiol.

The dye-sensitizer in the photoinitiation system may include, for blue area sensitization, 6-acetylamino-2-methyl-ceramidonin of the following Chemical Formula 3.

<Chemical Formula 3>

The electron donor in the photoinitiation system for the blue area sensitization may be tetrabutylammonium butyltriphenylborate of the following Chemical Formula 5.

<Chemical Formula 5>

The electron donor in the photoinitiation system for the blue area sensitization may be 5-methyl-1,3,4-thiadiazole-2-thiol.

The dye-sensitizer in the photoinitiation system may be new methylene blue for red area sensitization.

The electron donor in the photoinitiation system for the red area sensitization may be 5-methyl-1,3,4-thiadiazole-2-thiol, 1-(4-hydroxyphenyl)-1H-tetrazole-5-thiol, or a mixture thereof.

The polymer binder may include polyvinylpyrrolidone, cellulose acetobutyrate, polyvinyl acetate, polyvinyl butyral, or a mixture thereof.

An amount of the polymer binder may be about 45-50 wt %, an amount of the monomer for holographic recording may be about 40-46 wt %, and an amount of the dye-sensitizer may be about 0.1-0.5 wt % based on a total amount of the composition excluding the solvent.

The composition may further include a cross-linking monomer.

The composition may further include a surface-active substance.

According to an aspect of another exemplary embodiment, a hologram photopolymer layer formed by using the photopolymer composition is provided.

According to an aspect of another exemplary embodiment, a hologram recording medium includes a substrate; a photopolymer layer including at least one layer formed by using the photopolymer composition on the substrate; and a passivation layer on the photopolymer layer.

The substrate may include a transparent glass or plastic.

The passivation layer may include a polyester film.

A thickness of the photopolymer layer may be from about 30 μm to about 50 μm.

According to an aspect of another exemplary embodiment, a hologram recording medium includes a substrate; a photopolymer layer on the substrate, including a first photopolymer layer formed by using the photopolymer composition sensitive to a red area, a second photopolymer layer formed by using the photopolymer composition sensitive to a green area, and a third photopolymer layer formed by using the photopolymer composition sensitive to a blue area; and a passivation layer on the photopolymer layer.

The first photopolymer layer, the second photopolymer layer and the third photopolymer layer may be laminated.

According to one or more exemplary embodiments, a photopolymer composition for a hologram, the photopolymer composition including novel components and thus having high sensitivity in an entire visible light area and high diffraction efficiency, a photopolymer layer including the photopolymer composition, and photopolymer media including the photopolymer layer may be obtained.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, a photopolymer composition for a color transmission and reflective hologram in accordance with an exemplary embodiment will be described in detail.

The photopolymer composition includes a polymer binder, a monomer for holographic recording, and a photoinitiation system. The photoinitiation system may include a dye-sensitizer, an electron acceptor and electron donor, a hydrogen atom donor, and a solvent.

The polymer binder may include polyvinylpyrrolidone, cellulose acetobutyrate, polyvinyl acetate, polyvinyl butyral, or a mixture thereof, without limitation.

As the monomer, N-acryloylthiomorpholine of the following Chemical Formula 1 is used.

<Chemical Formula 1>

The N-acryloylthiomorpholine of Chemical Formula 1 is used as the component of the photopolymer composition for the first time in the art. The N-acryloylthiomorpholine may provide a high refractive index modulation (less than or equal to 0.01).

As the dye-sensitizer of the photoinitiation system, new methylene blue, thioerythrosine triethylammonium of Chemical Formula 2, 6-acetylamino-2-methylceramidonin of Chemical Formula 3, eosin, erythrosine, rose bengal, thionine, basic yellow, Pinacyanol chloride, rhodamine 6G, gallocyanine, ethyl violet, victoria blue R, Celestine blue, Quinaldine Red, crystal violet, Brilliant Green, Astrazon orange G, darrow red, pyronin Y, basic red 29, pyrylium iodide (pyrylium I), Safranin O, cyanine, methylene blue, Azure A, and the like may be used.

<Chemical Formula 2>

<Chemical Formula 3>

As the electron acceptor of the photoinitiation system, bis(4-tert-butylphenyl)iodine trifluoromethanesulfonate of Chemical Formula 4, etc. may be used.

<Chemical Formula 4>

As the electron donor of the photoinitiation system, tetrabutylammonium butyltriphenylborate of Chemical Formula 5, etc. may be used.

<Chemical Formula 5>

The photopolymer composition may further include diacrylamide and triacrylamide, that is, 1,4-bis(acryloyl)piperazine derivatives, tris(acryloyl) 1,4,7-triazacyclononan derivatives, or a mixture thereof as a cross-linking monomer, without limitation.

The cross-linking monomer is a monomer for forming a cross-linkage between polymer chains obtained from the result of photo polymerization of monomers for recording. The cross-linkage may provide stability and rigidity to a recorded hologram, thereby increasing the lifetime of the hologram.

The photopolymer composition may further include sodium bis(2-ethylhexyl) sulfosuccinate as a surface-active substance.

The solvent may include chloroform, acetone or a mixture thereof, without limitation.

The components of the photopolymer composition may be in the following amount range (by wt %) based on the total amount of the composition excluding the solvent. The amount of the polymer binder may be about 40-50 wt %. The amount of the monomer for recording may be about 40-46 wt %. The amount of the cross-linking monomer may be about 3-9 wt %. The amount of the dye-sensitizer may be about 0.01-0.5 wt %. The amount of the electron acceptor may be about 2-4 wt %. The amount of the electron donor may be about 1-7 wt %. The amount of a hydrogen atom donor may be about 1-6 wt %. The amount of the surface-active substance may be about 0.2-0.3 wt %.

Hereinafter, a photopolymer composition for a transmission or reflective hologram of specific colors in accordance with an example embodiment will be described in detail.

In order to obtain a photopolymer composition sensitizing in a red spectrum area, a photoinitiation system based on new methylene blue as a dye-sensitizer and an electron donor and an electron acceptor as co-initiators may be used. The new methylene blue may be included in the composition by about 0.02-0.03 wt %. The co-initiator may include 5-methyl-1,3,4-thiadiazole-2-thiol as the electron donor and 1-(4-hydroxyphenyl)-1H-tetrazole-5-thiol as a hydrogen atom donor. Each of the 5-methyl-1,3,4-thiadiazole-2-thiol and 1-(4-hydroxyphenyl)-1H-tetrazole-5-thiol may be included by about 1-6 wt %, respectively, in the composition. As the monomer for holographic recording, N-acryloylthiomorpholine of Chemical Formula 1 is used. As the polymer binder, the above described polyvinylpyrrolidone, cellulose acetobutyrate, polyvinyl acetate, polyvinyl butyral or a mixture thereof may be used without limitation. The composition may include sodium bis(2-ethylhexyl) sulfosuccinate as a surface-active substance to improve the properties of the composition. The photopolymer composition including the photoinitiation system has photosensitivity in a spectrum area of about 600 nm to about 690 nm.

In order to obtain a photopolymer composition sensitizing in a green spectrum area, a photoinitiation system based on xanthene dye series, for example, eosin, erythrosine, rose bengal as a dye-sensitizer, and an electron donor and an electron acceptor as co-initiators, is used. As the dye-sensitizer, thioerythrosine triethylammonium of Chemical Formula 2 may be used. The thioerythrosine triethylammonium dye may be included in the composition by the amount of about 0.25-0.35 wt %. This is unknown xanthene dye in the previous art.

<Chemical Formula 2>

The substitution of an oxygen atom in the xanthene dye molecule with a sulfur atom causes an yield increase in a triplet reactive state at molecule excitation. The additional substitution of a hydrogen atom in a thiofluorescein molecule with a heavy iodine atom may further increase the yield in the triplet reactive state of the xanthene dye. The photopolymer composition including the dye has sensitizing properties in a spectrum area of from about 505 nm to about 590 nm. The thioerythrosine has effective stabilizing properties, and thus, possibly increases the sensitivity of the photopolymer composition by about 10-15% when compared with an oxygen analog of erythrosine.

As the co-initiator of the thioerythrosine of Chemical Formula 2, an electron acceptor, a sulfonium salt, an iodonium salt or a mixture thereof may be used. For example, previously unused iodonium salt, bis(4-tert-butylphenyl)iodonium triflate of Chemical Formula 3 may be used. The bis(4-tert-butylphenyl)iodonium triflate may be included in the composition by about 2.4-3.4 wt %.

<Chemical Formula 3>

In addition, an electron donor, for example, 5-methyl-1,3,4-thiadiazole-2-thiol may be used as the co-initiator of the thioerythrosine of Chemical Formula 2. The 5-methyl-1,3,4-thiadiazole-2-thiol may be included in the composition by about 1-6 wt %. As the monomer for recording, N-acryloylthiomorpholine may be used. As the polymer binder, the above-described materials for polymer binder may be used.

In order to obtain a photopolymer composition sensitizing in a blue spectrum area, a photoinitiation system based on a previously unused ceramidonin derivative of 6-acetylamino-2-methylceramidonin of Chemical Formula 4 as a dye-sensitizer, and an electron donor and an electron acceptor as co-initiators is used.

<Chemical Formula 4>

The 6-acetylamino-2-methylceramidonin dye of Chemical Formula 4 illustrates high efficiency in the sensitization of free radical polymerization and is used as a complex with the co-initiator. 5-methyl-1,3,4-tiadiazole-2-thiol as the electron donor or an alkyltriphenylborate, that is, tetrabutylammonium butyltriphenylborate of Chemical Formula 5 as the electron donor may be used. The amount included of the 5-methyl-1,3,4-thiadiazole-2-thiol in the composition may be about 1-6 wt %. The tetrabutylammonium butyltriphenylborate may be included in the composition by about 4.5-6.5 wt %.

<Chemical Formula 5>

The 6-acetylamino-2-methylceramidonin dye of Chemical Formula 4 and the alkyltriphenyl borate of Chemical Formula 5 are used as the components of the photoinitiation system for the first time. The amount of the 6-acetylamido-2-methylceramidonin dye in the composition may be about 0.1-0.2 wt %.

In a composition including the 6-acetylamino-2-methylceramidonin as the dye-sensitizer, the absence of the co-initiator of tetrabutylammonium butyltriphenylborate may bring about a rapid decrease (to a few times) of the diffraction efficiency. The photopolymer material based on the composition has sensitizing properties in an area of from about 400 nm to about 525 nm.

Hereinafter, a photopolymer composition for a color transmitting and reflective hologram and a method of manufacturing a photopolymer layer in accordance with an exemplary embodiment will be described in detail.

The components of a photopolymer composition are sequentially dissolved in an organic solvent. The amount of each component of the composition may be determined by considering the above-described amounts of the composition. The organic solvent may be, for example, a mixture of chloroform and acetone (about 1:1-1:1.5 by volume ratio). The amount of the total amount of the composition with respect to the solvent may be about 1:20-1:5.

The solution is thoroughly stirred and coated on a transparent glass, film, or plastic substrate. The coating may be conducted by using a spin coating method, a spraying method, an inkjet printing method, a dipping method, a casting, a gravure coating, a bar coating, a roll coating, a wire bar coating, a screen coating, etc. After conducting the coating, the coated layer is dried at about 23-26° C. for about 18-20 hours in the presence of a solvent vapor, and the humidity of the organic solvent is less than or equal to 50%. The thickness of the photopolymer layer is determined by the amount of the composition used for the coating. The thickness of the photopolymer is about 40-45 μm after pouring about 30-35 μl/cm$^2$ of a composition including about 90 wt % of a solvent. After drying, the photopolymer layer is covered with a polyester film. The main function of the film is passivating the photo layer from oxygen during recording a hologram. The film also passivates the photopolymer layer from mechanical and environmental influences.

Hereinafter, recording media for a color transmission and reflective hologram in accordance with an example embodiment will be described in detail.

Figure 2:
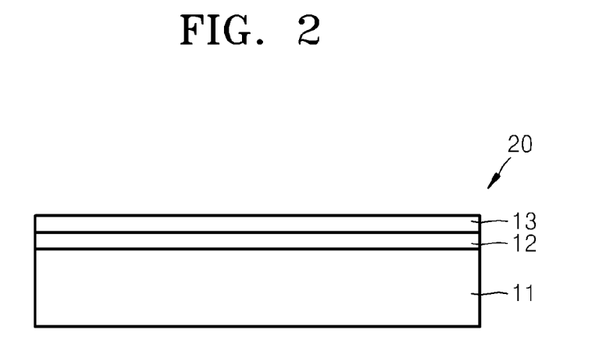
FIG. 2 is a schematic diagram of a recording medium for a color transmission and reflective hologram in accordance with an exemplary embodiment.

FIG. 2 is a schematic diagram illustrating a color transmission and reflective hologram in accordance with an exemplary embodiment. Referring to FIG. 2, a recording medium 20 for a hologram includes a substrate 11, a photopolymer layer 12 and a passivation layer 13.

The substrate 11 may be formed by using a transparent glass or plastic. The plastic for the substrate 11 may include polycarbonate (PC), polyethylene terephthalate (PET), polybutylene terephthalate, polyethylene, polypropylene, cellulose acetate, cellulose nitrate, polystyrene, polyepoxide, polysulfone, cellulose triacetate (CTA), polyamide, polymethyl methacrylate, polyvinyl chloride, polyvinyl butyral, polydicyclopentadiene or a mixture thereof.

The photopolymer layer 12 is formed on the substrate 11. The photopolymer layer 12 may be formed by coating the above-described photopolymer composition on the substrate 11. The photopolymer layer 12 may have a thickness of about 10-100 μm, about 20-80 μm, or about 30-50 μm. The photopolymer layer 12 may include a plurality of photopolymer layers. For example, the photopolymer layer 12 may include a first photopolymer layer sensitizing in a red spectrum area, a second photopolymer layer sensitizing in a green spectrum area, and a third photopolymer layer sensitizing in a blue spectrum area.

A passivation layer 13 is formed on the photopolymer layer 12. The passivation layer 13 protects the photopolymer layer 12 from oxygen during the recording of a hologram and also protects the photopolymer layer from mechanical and environmental influences. The passivation layer 13 may be formed by using, for example, a polyethylene film.

SYNTHETIC EXAMPLE

1. Synthesis of N-acryloylthiomorpholine

The synthesis of N-acryloylthiomorpholine was performed in a dry three-necked flask (500 ml). The flask was equipped with a mechanical stirrer, a thermometer and a dropping funnel for pressure equalization. 200 ml of benzole, 35 g of potassium carbonate and 20 ml of thiomorpholine were put into the flask and cooled to 0° C. A solution of acryloyl chloride (20 ml) in benzole (80 ml) was added drop by drop into the flask at about 0-2° C. for about 2 hours. During the above procedure, the content in the flask was stirred. Then, the reaction mixture was stirred at about 0-2° C. for about 1 hour. A white precipitate was filtered by using a Teflon funnel having a two-layered paper filter, washed by using benzole (3×50 ml), and squeezed.

The organic solvent was removed from the organic filtrate in a reaction bath at about 40-50° C. by using a rotor evaporator. A raw product (17.7 g) was distilled at a reduced pressure to obtain 13.0 g (42%) of N-acryloylthiomorpholine. This product was a viscous, transparent, and colorless oily liquid having good solubility with respect to chloroform, dichloromethane, benzole, chlorinated carbon, and most of the organic solvents.

2. Synthesis of thioerythrosine triethylammonium

Iodination of thiofluorescein (fluorescein in which oxygen is substituted with sulfur) was accomplished by a reaction with iodine molecules in 1N NaOH at 100° C. Under these conditions, tetraiodofluorescein (thioerythrosine) was formed with a 71% yield. The extinction ratio of the dye at spectrum maximum $\lambda_{max}$=542 nm was 1 g $\epsilon$=4.88 (0.1 N NaOH, water). IR spectrum, liquid paraffin, cm$^{-1}$: 1733 (C=O lactone). NMR 1H spectrum (CDCl$_3$), δ(ppm), m.p.: 6.01 s (2H, 2OH), 7.57 s (2H, H$^{1',8'}$) 7.58 m (2H, H$^{5,6}$), 7.72 m (1H, H$^7$), 7.94 m (1H, H$^4$).

Measured, %: C, 28.37; H, 0.98; I, 59.32; S, 3.71. C$_{20}$H$_8$I$_4$O$_4$S.

Calculated, %: C, 28.20; H, 0.95; I, 59.58; S, 3.76.

Hologram Recording

Photopolymer layers sensitized by methylene blue (red photopolymer), thioerythrosine triethylammonium (green photopolymer), and 6-acetylamino-2-methylceramidonin (blue photopolymer) were prepared for testing a hologram. The hologram was recorded by using an experimental apparatus schematically illustrated in FIG. 1.

Figure 1:
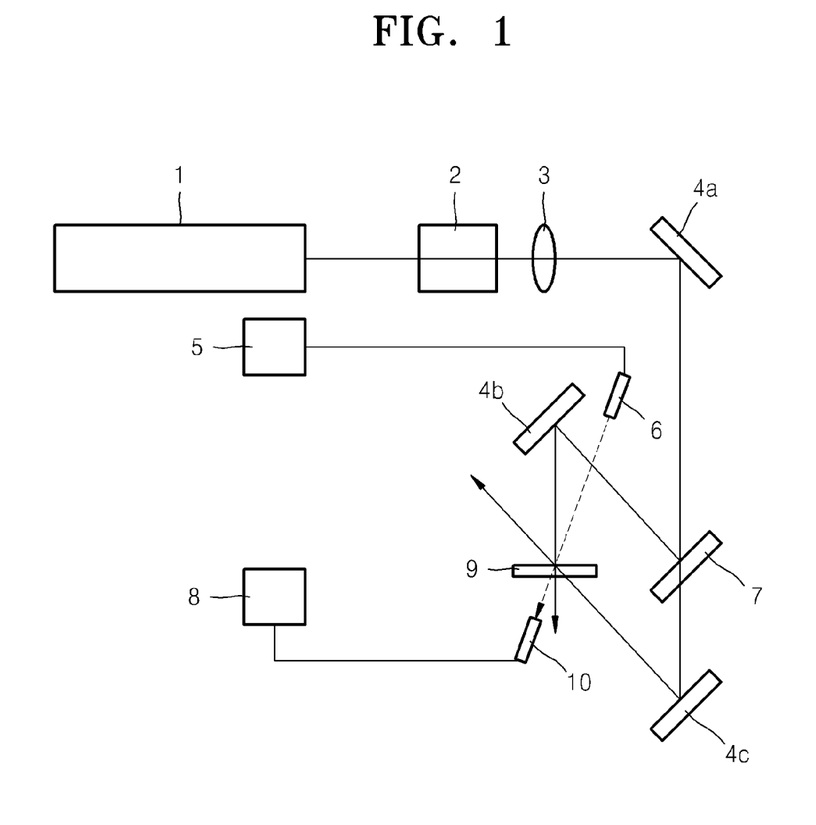
FIG. 1 is a schematic diagram of a system for recording a hologram.

Referring to FIG. 1, a beam output from a laser 1 passes through a filter 2 and a collimating lens 3, which forms a collimated beam. The collimated beam is reflected at a reflection mirror 4a and is split by a beam-splitting mirror 7 into two beams. A first of the two beams is reflected at reflection mirror 4b, a second of the two beams is reflected at reflection mirror 4c, and the two beams meet at a photopolymer layer 9, the first beam being incident on an upper surface of the photopolymer layer and the second beam being incident on a lower surface of the photopolymer layer, to form an interference pattern for generating a hologram. Reference numerals 5, 6, 8, and 10 are elements of a spectrometer system for recording a hologram recording degree in real time. Reference numeral 5 is a spectrometer valve including a light source, reference numeral 8 is a spectrometer, and reference numerals 6 and 10 are optical fibers used as light pipes for transmitting light.

He—Ne laser (633 nm), Nd:YAG:DPSS laser (532 nm) and Ar$^+$ laser (514 nm and 488 nm), or DPSS laser (473 nm) and semiconductor diode laser (655 nm) were used as the laser 1 for recording the hologram. The intensity of the laser beam was about 8-10 mWt/cm$^2$, and as a result, a holographic diffraction grating was formed in the photopolymer layer within about 3-5 seconds. The diffraction efficiency of the diffraction grating immediately after recording the hologram was about 30-50%. The recorded holographic image was stable, however, the photopolymer layer still included unreacted components (dye, monomer, etc.). For bleaching these components, a basic process for post-treatments (exposure to a halogen lamp having a 500 W power through radiation from a 10 cm distance for 1 minute (at the same time, heating to about 100-110° C.)) was used. From the treatment, the photopolymer layer had a low absorption in a visible light spectrum area and became chemically inactive. The diffraction efficiency was increased by about 75% or over.

Example 1

Holographic Photopolymer Material Sensitive in Red Spectrum Area and Sensitized by Methylene Blue Preparation of Composition 1 mg of methylene blue and 10 mg of sodium bis(2-ethylhexyl) sulfosuccinate were dissolved in 1 ml of chloroform and 200 μl of acetone to prepare a dye solution. To prepare a photosensitive composition, 12 mg of 1,4-bis(acryloyl)piperazine, 2.5 mg of 5-methyl-1,3,4-thiadiazole-2-thiol and 2.5 mg of 1-(4-hydroxyphenyl)-1H-tetrazole-5-thiol were dissolved in 250 μl of chloroform and 200 μl of acetone. Then, 10 μl of the dye solution, 120 μl of a monomer solution (N-acryloylthiomorpholine in chloroform by 1:1, by volume ratio), and 600 μl of a polymer binder solution (12 wt % of polyvinyl acetate in chloroform) were added into the thus obtained solution. All the components were thoroughly stirred by using a mechanical stirrer and an ultrasonic bath.

Manufacture of a Photopolymer Layer 650 ml of the thus prepared composition solution was poured on a microscope slide (76 mm×26 mm×1 mm). The thus obtained sample was covered with a Petri dish to obtain an optimized concentration of a solvent vapor above the surface of the photopolymer layer. The sample was dried under the Petri dish at about 23-26° C. for about 18-20 hours under a humidity of 50% or less. After the drying, a photopolymer layer of about 40-45 μm was formed. The photopolymer layer was covered with a passivation Mylar film.

Hologram Recording

The sample of the photopolymer layer was exposed to He—Ne (633 nm) and semiconductor diode (655 nm) lasers by using the set up illustrated in FIG. 1. As a result of the exposure, a phase reflective hologram was formed in the photopolymer layer. After recording the hologram, the sample was post-treated by a halogen lamp exposure and a short-time heating. The variables of the recorded hologram are illustrated in Table 1.

Example 2

Holographic Photopolymer Material Sensitive to Green Spectrum Area and Sensitized by Thioerythrosine Triethylammonium Preparation of Composition 4 mg of thioerythrosine triethylammonium was dissolved in 1 ml of chloroform and 1 ml of acetone to prepare a dye solution. To prepare a photosensitive composition, 9 mg of 1,4-bis(acryloyl)piperazine, 3.6 mg of bis(4-tert-butylphenyl) iodonium trifluoromethanesulfonate and 5.5 mg of 5-methyl-1,3,4-thiadiazole-2-thiol were dissolved in 180 μl of chloroform and 150 μl of acetone. Into the thus obtained solution, 200 μl of the dye solution, 90 μl of a monomer solution (N-acryloylthiomorpholine in chloroform by 1:1, by volume ratio), and 350 μl of a polymer binder solution (12 wt % of polyvinyl acetate in chloroform) were added. All the components were thoroughly stirred.

Manufacture of a Photopolymer Layer 650 ml of the thus prepared composition solution was poured on a microscope slide (76 mm×26 mm×1 mm) and was covered with a Petri dish. The sample was dried at about 23-26° C. for about 18-20 hours under a humidity of 50% or less. After the drying, a photopolymer layer of about 35-40 μm was formed. The photopolymer layer was covered with a passivation Mylar film.

Hologram Recording

The sample of the photopolymer layer was exposed to Ar+ (514 nm) and Nd:YAG:DPPS (532 nm) lasers by using the set up illustrated in FIG. 1. As the result of the exposure, a phase reflective hologram was formed in the photopolymer layer. After recording the hologram, the sample was post-treated by a halogen lamp exposure and a short-time heating. The variables of the recorded hologram are illustrated in Table 1.

Example 3

Holographic Photopolymer Material Sensitive to Blue Spectrum Area and Sensitized by 6-acetylamino-2-methylceramidonin Preparation of a Composition 1 mg of 6-acetylamino-2-methylceramidonin was dissolved in 1 ml of chloroform and 1 ml of acetone to prepare a dye solution. To prepare a photosensitive composition, 9 mg of 1,4-bis(acryloyl)piperazine, 7 mg of tetrabutylammonium triphenylbutylborate, and 5.5 mg of 5-methyl-1,3,4-thiadiazole-2-thiol were dissolved in 180 μl of chloroform and 150 μl of acetone. Into the thus obtained solution, 360 μl of the dye solution, 90 μl of a monomer solution (N-acryloylthiomorpholine in chloroform by 1:1, by volume ratio), and 350 μl of a polymer binder solution (12 wt % of polyvinyl acetate in chloroform) were added. All the components were thoroughly stirred.

Manufacture of a Photopolymer Layer 650 ml of the thus prepared composition solution was poured on a microscope slide (76 mm×26 mm×1 mm) and was covered with a Petri dish. The sample was dried at about 23-26° C. for about 18-20 hours under a humidity of 50% or less. After the drying, a photopolymer layer of about 35-40 μm was formed. The photopolymer layer was covered with a passivation Mylar film.

Recording of Hologram

The sample of the photopolymer layer was exposed to Ar+ (488 nm) and DSSP (532 nm) lasers by using the set up illustrated in FIG. 1. As a result of the exposure, a phase reflective hologram was formed in the photopolymer layer. After recording the hologram, the sample was post-treated by a halogen lamp exposure and a short-time heating. The variables of the recorded hologram are illustrated in Table 1.

TABLE 1

Properties of holographic photopolymer materials having various dye-sensitizers

| | Dye-sensitizer | Exposed wavelength, nm | sensitivity, mJ/cm² | Diffraction efficiency, % |
|---|---|---|---|---|
| Example 1 | Methylene blue | 633 | 25 | >80 |
| | | 655 | 25 | >70 |
| Example 2 | Thioerythrosine triethylammonium | 514 | 25 | >80 |
| | | 532 | 25 | >70 |

TABLE 1-continued

Properties of holographic photopolymer materials having various dye-sensitizers

| | Dye-sensitizer | Exposed wavelength, nm | sensitivity, mJ/cm² | Diffraction efficiency, % |
|---|---|---|---|---|
| Example 3 | 6-acetylamino-2-methylceramidonin | 488 | 25 | >70 |
| | | 473 | 25 | >70 |

Figure 3:
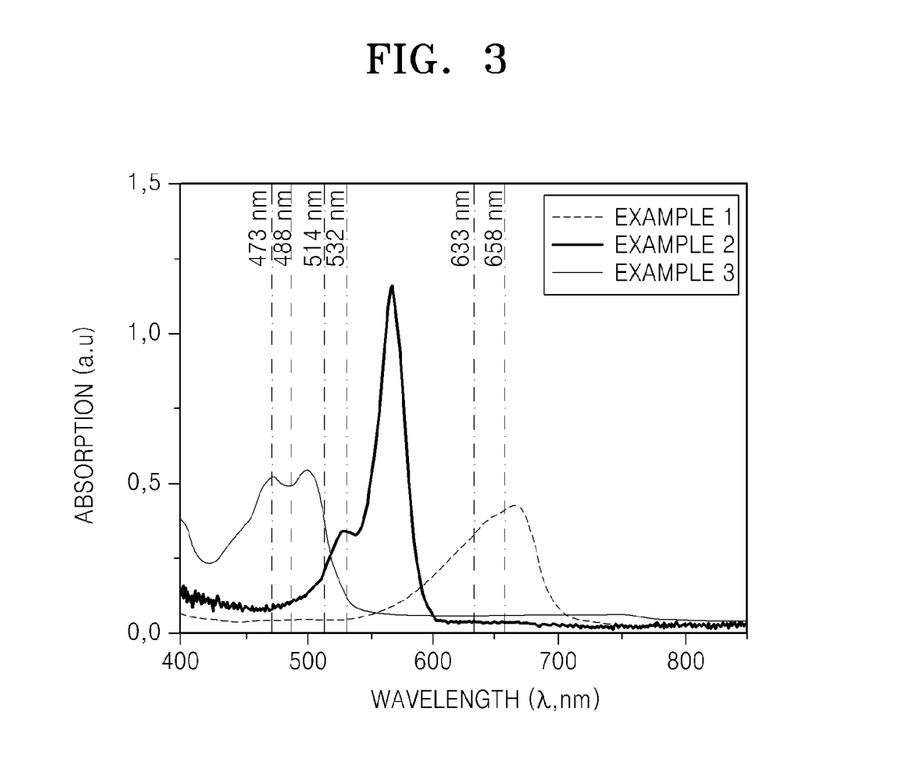
FIG. 3 illustrates absorption spectra of photopolymer layers according to Examples 1 to 3.

FIG. 3 illustrates the absorption spectra of photopolymer layers according to Examples 1 to 3. In the graphs in FIG. 3, the photopolymer layer including the new methylene blue according to Example 1 was confirmed to be sensitive to a red area, the photopolymer layer including the thioerythrosine triethylammonium dye according to Example 2 was confirmed to be sensitive to a green area, and the photopolymer layer including the 6-acetylamino-2-methylceramidonin dye according to Example 3 was confirmed to be sensitive to a blue area.

Figure 4:
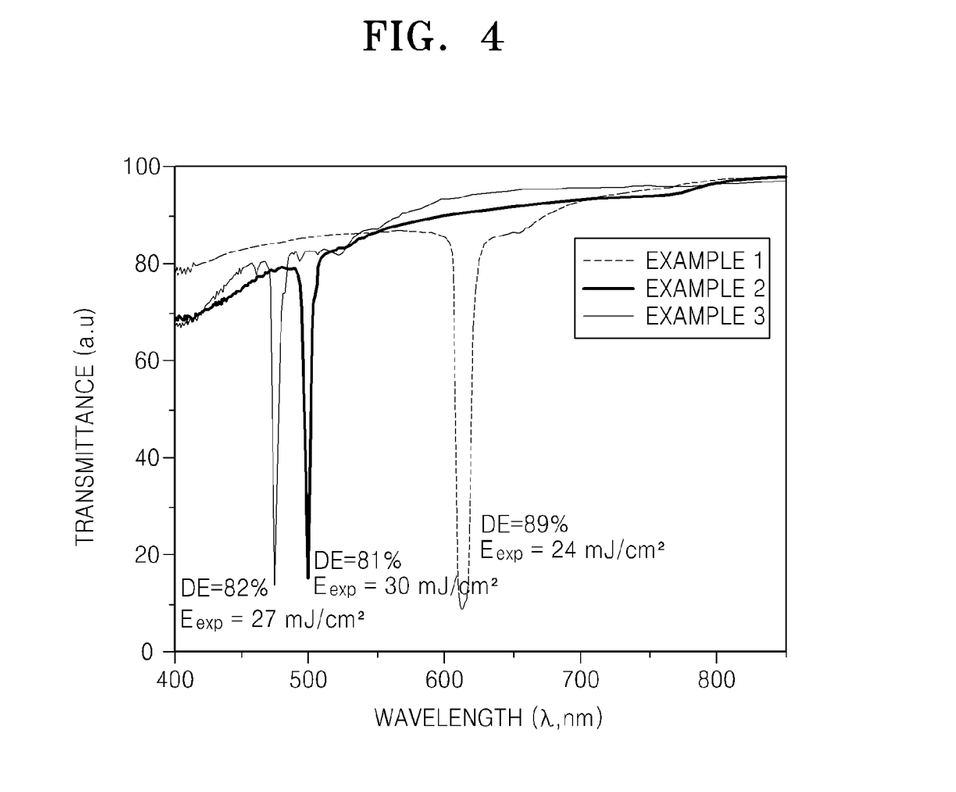
FIG. 4 illustrates transmittance spectra of photopolymer layers according to Examples 1 to 3.

FIG. 4 illustrates the transmittance spectra of photopolymer layers according to Examples 1 to 3. As apparent from the transmittance spectra in FIG. 4, the diffraction efficiency of the photopolymer layers according to Examples 1 to 3 is greater than or equal to 80%. In addition, the sensitivity of the photopolymer layers according to Examples 1 to 3 is low: about 24-30 mJ/cm².

A composition including N-acryloylthiomorpholin as a monomer component, a dye-sensitizer-thioerythrosine triethylammonium and an electron acceptor-bis(4-tert-butylphenyl)iodonium triflate as the components of the photoinitiation system sensitive to the radiation in a green spectrum area; and a dye-sensitizer-6-acetylamino-2-methylceramidonin and an electron donor-tetrabutylammonium butyltriphenylborate as the components of the photoinitiation system sensitive to the radiation in a blue spectrum area, has the following advantages: the diffraction efficiency of a recorded hologram is greater than 75%, the sensitivity in an entire spectrum area of about 400-700 nm is equal to 25 mJ/cm², and no cross decoloration at the exposure of a full color hologram is substantially observed. The failure to observe any cross decoloration is considered to be due to the properties of the dyes used.

When comparing the composition of exemplary embodiments described herein with similar and commonly used compositions, the properties of the claimed composition are different from the properties of the known compositions due to newly added components. As presented above, the newly added components include n-acryloylthiomorpholine as a monomer component, thioerythrosine triethylamine as a dye-sensitizer along with bis(4-tert-butylphenyl)iodine trifluoromethanesulfonate as an electron acceptor, and 6-acetylamino-2-methylceramidonin as a dye-sensitizer along with triphenyl(n-butyl)borate tetrabutyl ammonium as an electron donor.

According to the relevant literature in this field, the use of some of the materials described herein with respect to exemplary embodiments, for example, new methylene blue or 1,4-bis(acryloyl)piperazine in the photopolymer composition for holographic recording, has been known. However, the required properties may be obtained only when the known components are used along with the other components as described above. The required properties of the photopolymer materials include high diffraction efficiency, high sensitivity in a visible spectrum area when recording a transmittance and reflective hologram in real time, and high stability of a recorded hologram. The photopolymer composition described herein with respect to exemplary embodiments provides the required properties for holographic materials. The photopolymer materials obtained based on the above composition illustrate the same sensitivity of about 25 mJ/cm² in a spectrum area of about 400-700 nm. Meanwhile, during the exposure of a full color hologram in the photopolymer, intersection decoloration was not observed.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A photopolymer composition comprising:
a polymer binder;
a monomer for holographic recording;
a photoinitiation system comprising at least one of an electron acceptor, an electron donor and a hydrogen atom donor, and a dye-sensitizer; and
a solvent,
wherein the monomer for holographic recording comprises N-acryloylthiomorpholine of Chemical Formula 1

<Chemical Formula 1> wherein a dye sensitizer comprise 6-acetylamino-2-methylceramidonin of Chemical Formula 3 for blue area sensitization:

<Chemical Formula 3>

2. The photopolymer composition of claim 1, wherein the photoinitiation system comprises the electron donor which comprises tetrabutylammonium butyltriphenylborate of Chemical Formula 5

<Chemical Formula 5>

3. The photopolymer composition of claim 2, wherein the photoinitiation system comprises the electron donor which comprises 5-methyl-1,3,4-thiadiazole-2-thiol .

4. The photopolymer composition of claim 1, wherein the polymer binder comprises polyvinylpyrrolidone, cellulose acetobutyrate, polyvinyl acetate, polyvinyl butyral, or a mixture thereof.

5. The photopolymer composition of claim 1, wherein an amount of the polymer binder is about 45-50 wt %, an amount of the monomer for holographic recording is about 40-46 wt %, and the photoinitiation system comprises the dye-sensitizer in an amount of about 0.1-0.5 wt %, based on a total amount of the composition excluding the solvent.

6. The photopolymer composition of claim 1, further comprising a cross-linking monomer.

7. The photopolymer composition of claim 1, further comprising a surface-active substance.

8. A hologram photopolymer layer comprising a photopolymer composition comprising :
a polymer binder;
a monomer for holographic recording;
a photoinitiation system comprising at least one of an electron acceptor, an electron donor and a hydrogen atom donor, and a dye-sensitizer; and
a solvent,
wherein the monomer for holographic recording comprises N-acryloylthiomorpholine of Chemical Formula 1

<Chemical Formula 1> wherein a dye sensitizer comprise 6-acetylamino-2-methylceramidonin of Chemical Formula 3 for blue area sensitization:

<Chemical Formula 3>

9. A hologram recording medium comprising:
a substrate;
a photopolymer layer on the substrate, the photopolymer layer comprising a photopolymer composition comprising:
a polymer binder;
a monomer for holographic recording;
a photoinitiation system comprising at least one of an electron acceptor, an electron donor and a hydrogen atom donor, and a dye-sensitizer; and
a solvent,
wherein the monomer for holographic recording comprises N-acryloylthiomorpholine of Chemical Formula 1

<Chemical Formula 1> wherein a dye sensitizer comprise 6-acetylamino-2-methylceramidonin of Chemical Formula 3 for blue area sensitization:

<Chemical Formula 3> and a passivation layer on the photopolymer layer.

10. The hologram recording medium of claim 9, wherein the substrate comprises a transparent glass or plastic.

11. The hologram recording medium of claim 9, wherein the passivation layer comprises a polyester film.

12. The hologram recording medium of claim 9, wherein a thickness of the photopolymer layer is from about 30 μm to about 50 μm.

13. A hologram recording medium comprising:
a substrate;
a photopolymer layer on the substrate,
the photopolymer layer comprising:
a first photopolymer layer comprising a photopolymer composition comprising one of:
a dye sensitizer comprising thioerythrosine triethylammonium of Chemical Formula 2 for green area sensitization

<Chemical Formula 2> and an electron acceptor which comprises bis(4-tert-butylphenyl)iodonium triflate of Chemical Formula 4

<Chemical Formula 4> a second photopolymer layer comprising a photopolymer composition comprising one of:
a dye sensitizer comprising 6-acetylamino-2-methylceramidonin of Chemical Formula 3 for blue area sensitization:

<Chemical Formula 3> an electron donor comprising 5-methyl-1,3,4-thiadiazole-2-thiol, and
electron donor comprising tetrabutylammonium butyltriphenylborate of Chemical Formula 5

<Chemical Formula 5> and
a third photopolymer layer comprising a photopolymer composition comprising an electron donor which comprises 5-methyl-1,3,4-thiadiazole-2-thiol, 1-(4-hydroxyphenyl)-1H-tetrazole-5-thiol, or a mixture thereof; and
a passivation layer on the photopolymer layer.

14. A hologram recording medium of claim 13, wherein the first photopolymer layer, the second photopolymer layer, and the third photopolymer layer are laminated.

15. The hologram recording medium of claim 13, wherein the first photopolymer layer further comprises the electron donor comprising 5-methyl-1,3,4-thiadiazole-2-thiol.

16. The hologram recording medium of claim 13, wherein the third photopolymer layer comprises the dye-sensitizer comprising new methylene blue for red area sensitization.

* * * * *